(12) United States Patent
Toyoda et al.

(10) Patent No.: US 12,146,899 B2
(45) Date of Patent: Nov. 19, 2024

(54) CURRENT DETECTION RESISTOR AND CURRENT DETECTION APPARATUS

(71) Applicant: KOA CORPORATION, Ina (JP)

(72) Inventors: Susumu Toyoda, Nagano (JP); Keishi Nakamura, Nagano (JP); Shuhei Matsubara, Nagano (JP)

(73) Assignee: KOA CORPORATION, Nagano (JP)

( * ) Notice: Subject to any disclaimer, the term of this patent is extended or adjusted under 35 U.S.C. 154(b) by 143 days.

(21) Appl. No.: 17/916,641

(22) PCT Filed: Apr. 1, 2021

(86) PCT No.: PCT/JP2021/014223
§ 371 (c)(1),
(2) Date: Oct. 3, 2022

(87) PCT Pub. No.: WO2021/205992
PCT Pub. Date: Oct. 14, 2021

(65) Prior Publication Data
US 2023/0140922 A1    May 11, 2023

(30) Foreign Application Priority Data
Apr. 9, 2020   (JP) ................... 2020-070184

(51) Int. Cl.
*G01R 1/20*  (2006.01)
*H01C 1/142* (2006.01)
*H01C 17/00* (2006.01)

(52) U.S. Cl.
CPC ............. *G01R 1/203* (2013.01); *H01C 1/142* (2013.01); *H01C 17/006* (2013.01)

(58) Field of Classification Search
CPC .... G01R 1/203; G01R 19/0092; H01C 1/142; H01C 1/012; H01C 1/14; H01C 17/006; H01C 13/02
See application file for complete search history.

(56) References Cited

U.S. PATENT DOCUMENTS

| 2012/0200383 | A1* | 8/2012 | Lo ........................... H01C 7/003 338/314 |
| 2017/0162302 | A1* | 6/2017 | Chiku ...................... H01C 7/06 |
| 2020/0051717 | A1 | 2/2020 | Nakamura et al. |
| 2022/0049997 | A1* | 2/2022 | Katsuhara ............ G06F 3/0445 |

FOREIGN PATENT DOCUMENTS

| CN | 110447079 A | * 11/2019 | ............ G01R 1/203 |
| JP | 2007-329419 A | 12/2007 | |
| JP | 2018-170478 A | 11/2018 | |

OTHER PUBLICATIONS

International Search Report, English translation, in Application No. PCT/JP2021/014223, dated Jun. 22, 2021, 2 pages.
Written Opinion, PCT/ISA/237 in Application No. PCT/JP2021/014223, dated Jun. 10, 2021, 4 pages.

* cited by examiner

*Primary Examiner* — Lee E Rodak
*Assistant Examiner* — Demetrius R Pretlow
(74) *Attorney, Agent, or Firm* — Crowell & Moring LLP

(57) ABSTRACT

The mounting area for an electronic component and a resistor for current detection is reduced. A current detection resistor for detecting current includes a plate-like resistive body, and a first electrode and an opposite second electrode which are stacked in a thickness direction of the resistive body and are disposed so as to sandwich the resistive body. The first electrode has a groove portion.

5 Claims, 3 Drawing Sheets

CURRENT DETECTION RESISTOR AND CURRENT DETECTION APPARATUS

RELATED APPLICATIONS

This application is a 371 application of PCT/JP2021/014223 having an international filing date of Apr. 1, 2021, which claims priority to JP 2020-070184 filed Apr. 9, 2020, the entire content of each of which is incorporated herein by reference.

TECHNICAL FIELD

The present invention relates to a current detection resistor and a current detection apparatus.

BACKGROUND ART

Recent years have seen an increase in electric currents used in electronic devices. This has stimulated efforts to develop modules referred to as power modules for performing conversion and control of electric power by switching a power semiconductor. The power semiconductor requires a current detection element for detecting current, such as a current-detection shunt resistor.

Also, in order to address an increase in electric power while minimizing the volume of the module, which tends to be large in size due to being a power module, intense research and development is being conducted to achieve higher power and higher density. Thus, the demand for minimizing the mounting area for components is increasing year after year.

Against the above background, there is a need for reducing the mounting area for a shunt resistor for power modules.

For example, Patent Literature 1 proposes an example in which a resistor is mounted directly on an upper surface of a transistor.

Semiconductors such as insulated-gate bipolar transistors (IGBT) adopted in power modules have a complex structure due to, for example, electrodes disposed on the upper surface being partitioned by an insulating film (insulating protection film). Accordingly, it is difficult to obtain a mounting structure in which the structure of such a vertical shunt resistor is provided on the upper surface of a power semiconductor (see FIG. 8 of Patent Literature 1, for example).

CITATION LIST

Patent Literature

Patent Literature 1: JP 2018-170478 A

SUMMARY OF INVENTION

Technical Problem

FIG. 6 is a perspective view of an example of a substrate mounting structure X of a conventional resistor and a power module.

As illustrated in FIG. 6, in a semiconductor (for example, an IGBT device) 121 used in the power module, on a first surface (upper surface) opposite to a second surface (lower surface) mounted on a substrate 101, divided portions 127a are formed, forming emitter electrodes 127 comprising a comb-shaped electrical conductor. The emitter electrodes 127 may be configured such that at least a part of the electrodes is separated.

An IGBT device is a device of which the input portion has a MOSFET structure and the output portion has a bipolar structure. The device is a transistor which, despite being a bipolar-type device that uses the two types of carriers of electron and hole, achieves both a low saturation voltage (corresponding to a low on-resistance of a power MOSFET) and a relatively fast switching characteristic. A semiconductor layer 131 has an $n^+$-$p^+$-$n^-$-$p^+$ series structure, for example.

As illustrated in FIG. 6, the IGBT device 121 has four divided electrodes (emitter electrodes in contact with the first conductivity-type semiconductor ($n^+$)) 127 on the first surface. Each divided electrode 127 is exposed from an insulating region comprising an insulating film 133. On the first surface, a gate electrode 131a exposed from the insulating film 133 is formed in a region different from the emitter electrodes 127.

On the second surface, a collector electrode (not illustrated) is formed.

In the IGBT device 121, a current is controlled by a voltage signal to the gate electrode 131a, and flows from the collector electrode disposed on the second surface of the IGBT device toward the emitter electrodes 127 disposed on the first surface.

On the mounting substrate 101, the IGBT device 121 and a shunt resistor 111 provided adjacent thereto are connected. The shunt resistor 111 is formed of a structure in which a first electrode 115a and a second electrode 115b are disposed on either side of a resistive body 113 with, for example, end faces of the resistive body 113 abutting one end face of each of the first electrode 115a and the second electrode 115b. A voltmeter 117 is used to measure a voltage between the first electrode 115a and the second electrode 115b via bonding wires 118, whereby the emitter current of the IGBT device 121 can be detected.

Reference signs 116, 119, 125 refer to metal pads provided on the substrate 101.

For example, in the conventional mounting structure X illustrated in FIG. 6, the emitter electrodes 127 and the pads on which the shunt resistor 111 are mounted are connected by bonding wires 141 to construct current paths. In this case, by providing a plurality of the bonding wires 141 corresponding to the number of the emitter electrodes 127, it is possible to lower the electric resistance of the bonding wires 141 and to accommodate to an application of large currents.

However, the conventional shunt resistor 111 illustrated in FIG. 6 is mounted around a semiconductor device such as the IGBT device 121, resulting in a correspondingly greater footprint of the module (mounting structure).

It is an objective of the present invention to reduce the mounting area for an electronic component, such as a semiconductor device, and a resistor for current detection.

Solution to Problem

According to an aspect of the present invention, there is provided a current detection resistor for detecting current. The current detection resistor includes a plate-like resistive body, and a first electrode and an opposite second electrode which are stacked in a thickness direction of the resistive body and are disposed so as to sandwich the resistive body. The first electrode has a groove portion.

In this way, when a resistor for current detection is integrated with an electronic component, such as a semiconductor device, in the thickness (vertical) direction, the mounting area for the integrated circuit can be reduced.

Further, a volume of reservoir for an adhesive for adhering the electronic component, such as a semiconductor device, to the resistor for current detection can be secured.

Preferably, the groove portion may have a depth less than or equal to ½ of a thickness of the first electrode. Preferably, the groove portion may have a depth greater than a thickness of a connecting material applied between the resistor for current detection and the electronic component connected thereto.

Preferably, the first electrode may have formed thereon a surface processing film including an Ni material. Preferably, the second electrode may have formed thereon a surface processing film of an Ni material, an Al material, or an Au material.

The first electrode and the resistive body of the current detection resistor may be cut to form an exposed region in which the second electrode is exposed for wire bonding.

According to another aspect of the present invention, there is provided a current detection apparatus including a stacked-structure electronic component disposed on a mounting substrate, and a current detection resistor for detecting a current in the electronic component. The current detection resistor includes a resistive body having an area smaller than an electrode region on a first surface of the electronic component on which the current detection resistor is disposed, and a first electrode and a second electrode which are stacked in a thickness direction of the resistive body and are disposed so as to sandwich the resistive body, the first electrode being disposed on a second surface side and the second electrode being disposed on a first surface side opposite to the second surface side, the first electrode having a groove portion.

Preferably, the groove portion on the first surface of the current detection resistor may be provided in a position avoiding an insulating film separating the electrode region on the first surface of the stacked-structure electronic component into a plurality of portions.

The present description incorporates the contents disclosed in JP Patent Application No. 2020-070184, from which the present application claims priority.

Advantageous Effects of Invention

According to the present invention, the mounting area for an electronic component, such as a semiconductor device, and a resistor for current detection can be reduced.

Further, a volume of reservoir for an adhesive adhering the electronic component, such as a semiconductor device, to the resistor for current detection can be secured.

DESCRIPTION OF EMBODIMENTS

In the following, a resistor according to an embodiment of the present invention and a mounting structure therefor will be described with reference to the drawings.

First Embodiment

Figure 1:
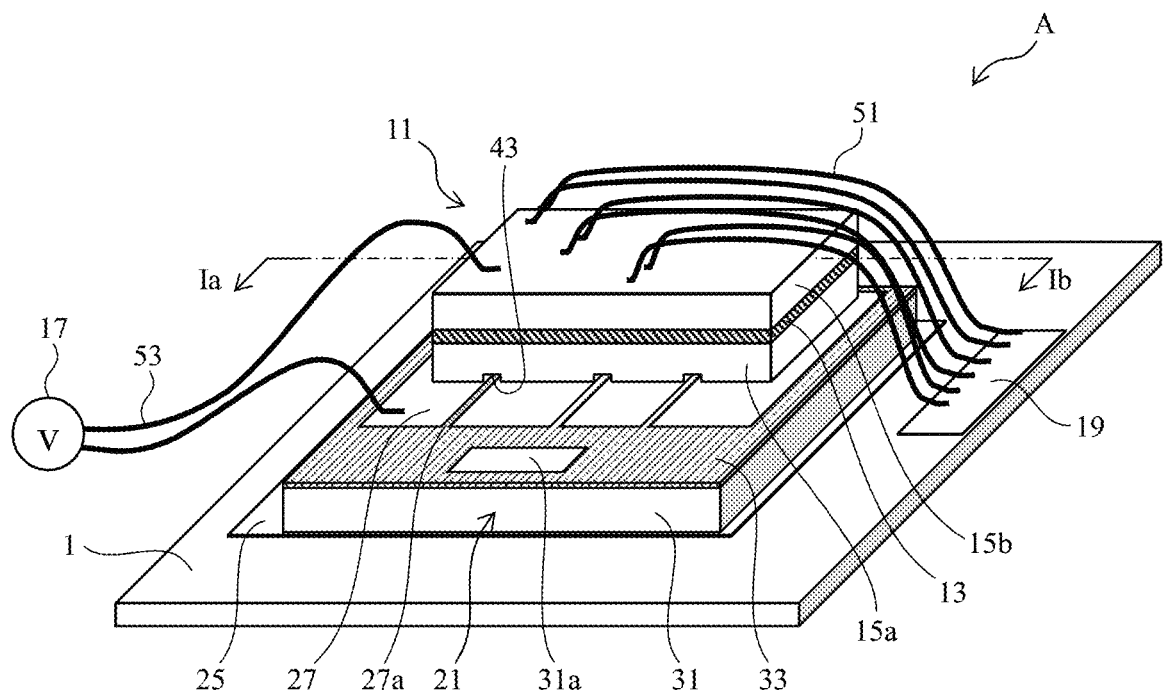
FIG. 1 is a perspective view of a resistor according to a first embodiment of the present invention, and an example of a mounting structure therefor.
Figure 6:
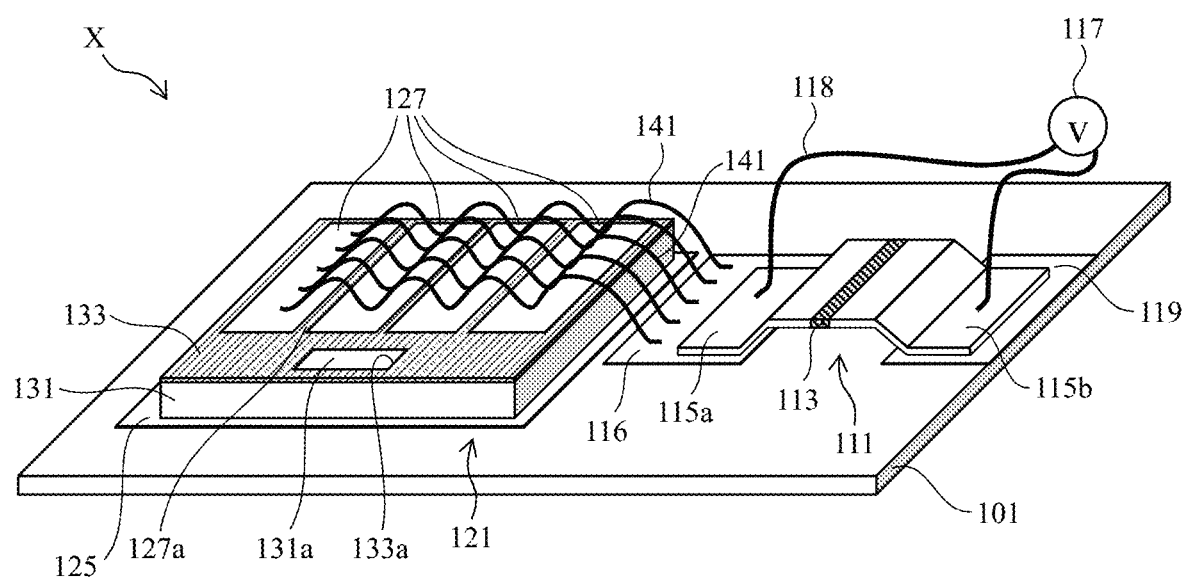
FIG. 6 is a perspective view of an example of a substrate mounting structure of a conventional resistor and power module.

FIG. 1 is a perspective view of the resistor according to a first embodiment of the present invention and an example of a mounting structure therefor. As a power semiconductor device, an IGBT having a structure similar to that of FIG. 6 will be described by way of example.

Specifically, an IGBT device 21 includes a collector electrode (not illustrated), a gate electrode 31a, emitter electrodes 27, a semiconductor layer 31, and an insulating film 33.

A vertical shunt resistor 11 includes a first electrode 15a/a resistive body 13/a second electrode 15b. Reference signs 19, 25 designate metal pads provided on the substrate.

In the example described below, the object of measurement by the current detection device is a current that flows through the IGBT device. However, the object of measurement by the current detection device may be a current that flows through any vertical electronic component, including a transistor, a capacitor, and an inductor. Structures for detecting currents in such electronic components are also within the scope of the present invention.

A mounting surface of the mounting substrate 1 is referred to as a first surface, and a surface opposite thereto is referred to as a second surface.

1) Regarding Vertical Shunt Resistor

The IGBT device 21 has a first surface on which the vertical shunt resistor 11 is disposed. The shunt resistor 11 is sized to fit within an area in which a plurality of emitter electrodes 27 are disposed. The vertical shunt resistor 11 has a stacked structure comprising a plate-like first electrode 15a/a plate-like resistive body 13/a plate-like second electrode 15b. The first electrode 15a and the second electrode 15b are formed on first and second surfaces of the resistive body 13 from a material having a smaller electric resistance than the resistive body 13.

The electrode material is an electrically conductive metal material, such as Cu. The resistive body material is a metal material, such as a Cu—Ni-based, a Cu—Mn-based, or a Ni—Cr-based metal material, or a composite material of such a metal material and ceramics.

Figure 2:
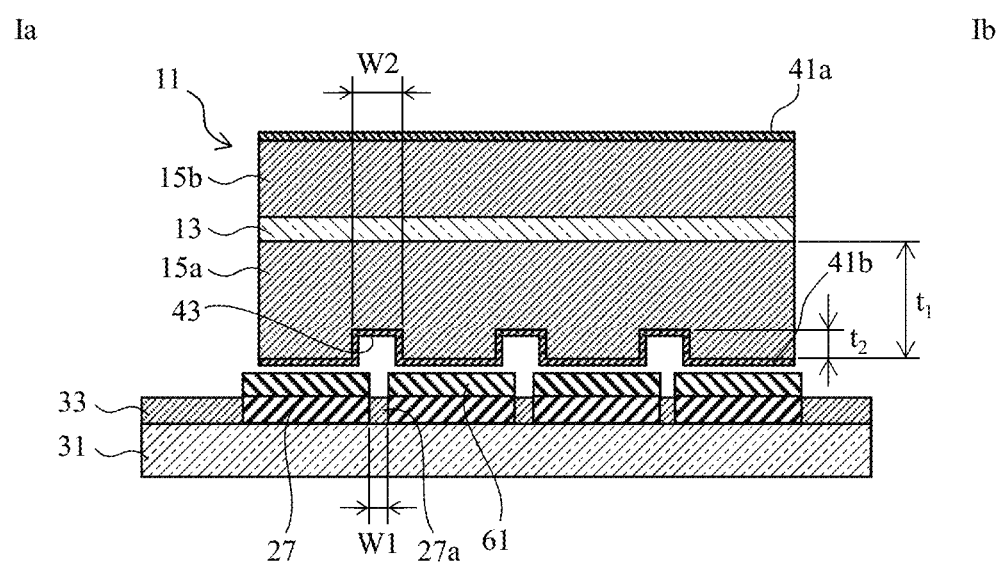
FIG. 2 illustrates a vertical shunt resistor before being mounted on a first surface of an IGBT device.
Figure 3:
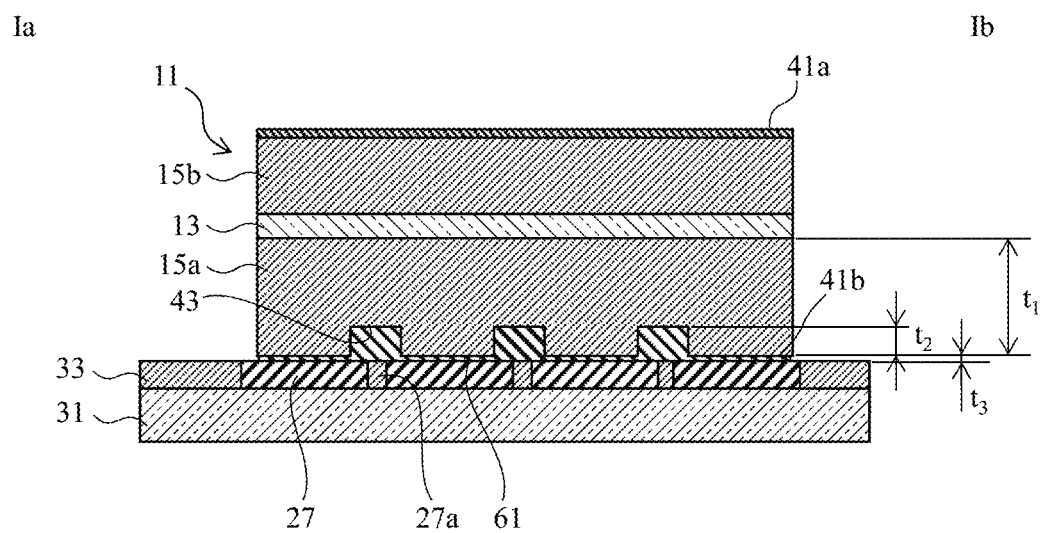
FIG. 3 illustrates the vertical shunt resistor after being mounted on the first surface of the IGBT device.

FIG. 2 and FIG. 3 are cross-sectional views taken along line Ia-Ib of FIG. 1. FIG. 2 illustrates the vertical shunt resistor 11 before being connected to the first surface of the IGBT device 21 by soldering or the like. FIG. 3 illustrates the vertical shunt resistor 11 after being connected to the first surface of the IGBT device 21 by soldering or the like. Besides soldering, other connecting materials may be used, such as a paste of nano-silver or nano-copper, or a resin silver paste. That is, the connecting material is not limited to solder.

By means of the configuration of 1) above, the vertical shunt resistor 11 can be mounted on the first surface of the IGBT device 21. Accordingly, it is possible to eliminate the footprint that would be required on the module for mounting the mounting substrate vertical shunt resistor 11. This also eliminates the need for bonding wires and the like for connecting the power semiconductor device and the shunt resistor together.

2) Regarding Mounting Structure

As illustrated in FIG. 2 and FIG. 3, on the first surface of the IGBT device 21, the emitter electrodes 27 are formed with a comb-shaped electrical conductor, the emitter electrodes 27 having gap regions 27a separating the plurality of electrodes in a plane. The emitter electrodes 27 may be configured such that at least one part thereof is separated. The insulating film 33 is exposed from the gap regions 27a.

In the mounting structure, the first electrode 15a of the vertical shunt resistor 11 has groove portions 43 formed therein, corresponding to the gap regions 27a. In this way, it is possible to keep a distance between the surface of the insulating film 33 and the facing surfaces (bottom surfaces) of the groove portions on the first surface side.

The gap regions 27a have a width W1 and the groove portions 43 have a width W2, where W2>W1, such as W2>2W1. In this way, the gap regions 27a can be located within the width of the groove portions 43.

The groove portions 43 have a depth t2, and the first electrode 15a has a thickness t1, where t2 is preferably less than a remaining thickness (t2<(t1−t2)). Preferably, the relationship may be t1/2>t2, for example.

In addition, the depth t2 of the groove portions 43 may preferably be greater than a coating thickness t3 of the bonding material between the vertical shunt resistor 11 and the IGBT device 21, such as solder paste 61.

In this way, the solder paste 61 can be contained within the groove portions 43. Thus, the solder paste 61 can be prevented from extending beyond the device region.

The groove portions 43 may have an interval equal to the interval of the gap regions 27a. The width and depth of the gap regions 27a are parameters that may be changed depending on a predetermined process.

A second surface of the vertical shunt resistor 11 is desirably provided with a surface processing layer 41b for enhancing adhesiveness, which is formed by performing surface treatment prior to bonding, in order to improve adhesion with the bonding material 61.

From 2) described above, when the IGBT device 21 and the vertical shunt resistor 11 are bonded together with solder, for example, the groove portions 43 provided in the first electrode 15a serve as a solder reservoir. Thus, with the groove portions 43, it is possible to suppress attachment of excess solder to the first surface of the IGBT device or to the sides of the vertical shunt resistor 11 (see FIG. 3).

In addition, the insulating film 33 of the IGBT device 21 and the first electrode 15a of the vertical shunt resistor 11 not contacting each other provides the effect of preventing destruction of the insulating film 33.

Because the resistance value of a shunt resistor is often very low, such as about 1 mΩ or 50μΩ, it is important to make the potential distribution of an electrode, such as the first electrode 15a, uniform. Thus, the thickness of the electrode remaining portion (t1−t2) after the groove portions are formed in the first electrode 15a is made greater than the depth t2 of the groove portions 43, whereby the potential distribution in the electrode can be made uniform.

The thickness t3 of the solder paste 61 as the bonding material is typically about 50 μm. Thus, in this case, the groove depth is desirably greater than or equal to 50 μm, and the thickness of the first electrode 15a is desirably twice as thick, or greater than or equal to 100 μm.

The interval of metal terminals of a power semiconductor is about 0.1 mm to 0.2 mm. Thus, the width of the grooves on the shunt lower surface needs to be greater than that interval, and is in this case desirably about 0.2 mm to 0.4 mm.

3) Regarding Electrode Surface Treatment for Vertical Shunt Resistor

Further, the second electrode 15b of the vertical shunt resistor 11 is connected by means of bonding wires 51, a lead frame, and the like. Thus, in order to provide surface treatment to facilitate such connections and improve connectivity, it is preferable to form a surface processing layer 41a by plating the surface with Ni or Sn, for example.

In 3) described above, it is necessary to secure a current path and to connect the bonding wires 41 for voltage signal detection. Thus, it is preferable to perform electrode surface processing by Ni plating or Au plating, or by means of an Al pad or the like. Further, as illustrated in FIG. 1, for voltage signal detection, it is necessary to perform wire bonding on the emitter electrodes 27 of the IGBT device 21, in addition to on the second electrode 15b of the vertical shunt resistor 11.

As described above, according to the present embodiment, it is possible to reduce the mounting area in the current detection resistor in which a power module and a resistor are mounted.

It is to be noted that the vertical resistor is not limited to an IGBT device as a semiconductor device, but may be mounted on other semiconductor devices, such as a MOSFET device. It will be appreciated that the dimensions of the vertical resistor, the shape of the groove portions of the first electrode and the like may require design changes, depending on the shape of the semiconductor device.

Second Embodiment

Figure 4:
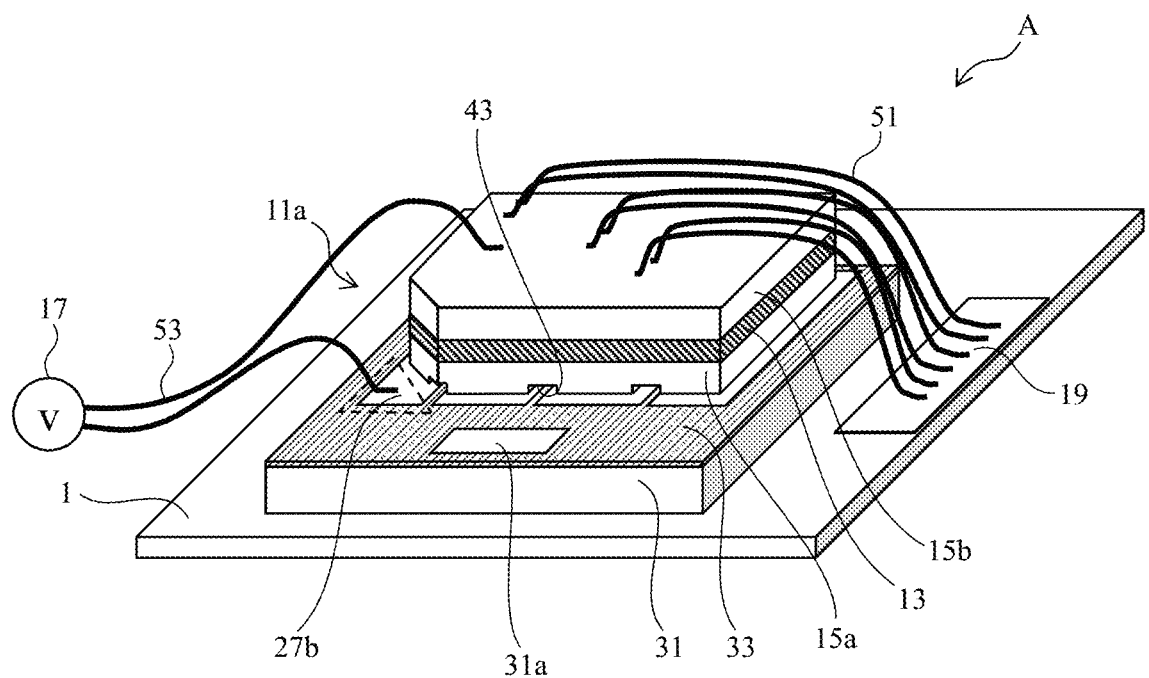
FIG. 4 is a perspective view of a resistor according to a second embodiment of the present invention, and an example of a mounting structure therefor.

A second embodiment of the present invention will be described. FIG. 4 is a perspective view of a resistor according to the second embodiment of the present invention, and an example of a mounting structure therefor.

In the mounting structure illustrated in FIG. 2, if the vertical shunt resistor 11 is smaller than the region of the first surface of the IGBT device 21, it is possible to provide a region, on the insulating film 33 on the first surface of the IGBT device 21, in which the gate electrode 31a for connecting bonding wires 53 is exposed.

However, in some cases, it may be impossible to secure a sufficient region in the emitter electrodes 27 of the IGBT device 21 for connecting the bonding wires 53.

In such cases, as illustrated in FIG. 4, a part of a corner of the vertical shunt resistor 11 may be cut to form a cut shape 11a. In this way, a partial region 27b of the emitter electrodes 27 of the IGBT device 21 can be exposed to secure a location for connecting the bonding wires 53 to the emitter electrodes 27.

Third Embodiment

Next, a third embodiment of the present invention will be described. The shape of the grooves of the second electrode 15b of the vertical shunt resistor 11 may be any shape that avoids contact with the insulating film 33 of the semiconductor.

Figure 5:
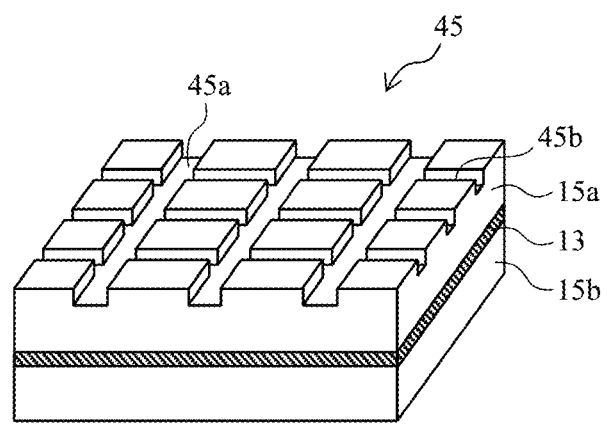
FIG. 5 illustrates a modification of groove portions of a second electrode according to the present embodiment.

FIG. 5 illustrates a modification of the groove portions of the first electrode 15a according to the present embodiment. Reference will also be made to FIG. 1 as needed. FIG. 5 shows an inverted view of FIG. 1, where the first electrode 15a and the second electrode 15b are formed on the first and second surfaces of the resistive body 13 from a material having a smaller electric resistance than the resistive body 13.

As illustrated in FIG. 5, groove portions 45a are formed in the first electrode 15a corresponding to the regions between the emitter electrodes 27 of the IGBT device 21 in which the insulating film 33 is exposed. Groove portions 45b may be provided extending in a direction intersecting, such as orthogonal to, the groove portions 45a. The groove portions 45b are not provided in positions corresponding to the regions exposing the insulating film 33. However, in this way, the volume of the groove portions 45b can be added to the volume of the groove portions 45a to obtain a volume of the solder reservoir. Thus, the volume of the solder reservoir can be increased and a necessary volume can be secured.

In the foregoing embodiments, the illustrated configurations and the like are not limiting and may be modified, as appropriate, as long as the effects of the present invention can be obtained. The embodiments may otherwise be modified and implemented, as appropriate, without departing from the range of the objective of the present invention. The respective constituent elements of the present invention may be selectively added or omitted as needed, and an invention comprising a selectively added or omitted configuration is also included in the present invention.

INDUSTRIAL APPLICABILITY

The present invention may be utilized for a current detection resistor and a mounting structure for a current detection resistor.

REFERENCE SIGNS LIST

1 Mounting substrate
11 Vertical shunt resistor
13 Resistive body
15a First electrode
15b Second electrode
21 IGBT device
27 Emitter electrode
27a Gap region
31 Semiconductor layer
31a Gate electrode
33 Insulating film
41a, 41b Surface processing layer
43, 45a, 45b Groove portion
51, 53 Bonding wire
61 Bonding material (solder paste)

All publications, patents and patent applications cited in the present description are incorporated herein by reference in their entirety.

The invention claimed is:

1. A current detection resistor for use in detecting current flowing through an electronic component having at least two terminals separated at an interval between them, comprising:
   a plate-like resistive body having a thickness; and
   a first electrode and an opposite second electrode which form a stack in which the first and second electrodes are stacked in a direction of the thickness of the resistive body so as to sandwich the resistive body between them, the first electrode forming a first end of the stack in the direction of the thickness of the resistive body and the second electrode forming a second end of the stack opposite to the first end in the direction of the thickness of the resistive body,
   wherein the first electrode has a first contact surface, at the first end of the stack, that is arranged in use in direct contact with the at least two terminals of the electronic component, and the first contact surface of the first electrode has a groove portion formed in alignment with the interval between the at least two terminals of the electronic component, and further wherein the second electrode has a second surface at the second end of the stack, and the second surface is devoid of any groove.

2. The current detection resistor according to claim 1, wherein the groove portion has a depth less than or equal to ½ of a thickness of the first electrode.

3. The current detection resistor according to claim 1, wherein the first electrode has formed thereon a surface processing film including an Ni material.

4. The current detection resistor according to claim 1, wherein the second electrode has formed thereon a surface processing film of an Ni material, an Al material, or an Au material.

5. A current detection apparatus comprising:
   a stacked-structure electronic component disposed on a mounting substrate, wherein the electronic component has a first surface attached to the mounting substrate and a second surface arranged opposite to the first surface, the second surface including an electrode region in which at least two terminals are provided in separation from each other at an interval that exposes an insulating film in the second surface between the at least two terminals; and
   a current detection resistor for detecting a current flowing through the electronic component,
   wherein the current detection resistor includes a planar resistive body having a thickness and end areas arranged opposite to each other in a direction of the thickness, the end areas being smaller than the electrode region defined in the second surface of the electronic component
   wherein the current detection resistor further includes a first electrode and a second electrode which form a stack in which the first and second electrodes are stacked in the direction of the thickness of the resistive body so as to sandwich the resistive body between them, the first electrode forming one end of the stack in the direction of the thickness of the resistive body,
   further wherein the first electrode has a first contact surface, at said one end of the stack, that is placed in direct contact with the at least two terminals of the electronic component, and the first contact surface of the first electrode has a groove portion formed in alignment with the interval between the at least two terminals such that the groove portion has a width wider than the interval to avoid electrical contact between the insulating film exposed in the interval and the current detection resistor.

* * * * *